United States Patent [19]

Wilson et al.

[11] Patent Number: 4,747,105
[45] Date of Patent: May 24, 1988

[54] LINEAR FEEDBACK SEQUENCE DETECTION WITH ERROR CORRECTION

[75] Inventors: Alan L. Wilson, Hoffman Estates; Michael W. Bright, Arlington Heights; Eric F. Ziolko, Schaumburg, all of Ill.

[73] Assignee: Motorola, Inc., Schaumburg, Ill.

[21] Appl. No.: 903,335

[22] Filed: Sep. 3, 1986

[51] Int. Cl.⁴ .................................. G06F 11/10
[52] U.S. Cl. .................................. 371/47; 371/40; 371/42; 371/45
[58] Field of Search .................. 371/40, 41, 42, 45, 371/43; 455/83; 375/116; 364/200 MS File, 900 MS File

[56] References Cited

U.S. PATENT DOCUMENTS 4,404,675  9/1983  Kanchevski ................... 371/47
4,667,327  5/1987  Bright ............................ 371/47
4,686,690  8/1987  Sato ............................... 371/47

Primary Examiner—Michael R. Fleming
Attorney, Agent, or Firm—Melvin A. Schechtman

[57] ABSTRACT

A detector locates a shift register sequence within a digital data stream by correlating the data stream with a sequence generated locally from a portion of the data stream. Error correction circuitry estimates errors that may have corrupted the sequence during transmission across a noisy channel and corrects them to the extent possible. The data stream and local sequence are correlated during an interval that is shifted either ahead or behind the portion of the error-corrected data stream used to initialize the local sequence generator, thereby avoiding the region during which short-term correlation between the data stream and local sequence would otherwise cause false indications of detection when only noise or random data is being received.

20 Claims, 5 Drawing Sheets

LINEAR FEEDBACK SEQUENCE DETECTION WITH ERROR CORRECTION

TECHNICAL FIELD

This invention relates in general to synchronous digital communication systems and in particular to detection of error-corrected, linear feedback shift register sequences.

BACKGROUND ART

Sequences whose characteristics are known to a receiver are used for a number of purposes in digital communication systems. For example, different portions of a long sequence can be assigned as characteristic addresses to a number of individual receivers in a group. In a secure transmission system, synchronized pseudorandom sequences can be used in a transmitter to encrypt messages and in a receiver to recover them. These and other applications require that the receiver be able to detect sequences in the presence of arbitrary digital data.

Linear feedback shift register (LFSR) sequences have frequently been used for these purposes. An LFSR sequence has the property that, by knowing a small portion of it and the rules for deriving it, a receiver can compute the entire sequence. Making use of this property, one method to detect an LFSR sequence within a received bit stream is to have in both transmitter and receiver shift registers that generate sequences according to the same algorithm. The receiver loads a portion of the bit stream into its local shift register and then sequences through successive states in time with the received bit stream. A detector correlates the local sequence with the incoming bit stream. If sufficient bits agree within a given measuring interval, then the detector concludes that the incoming bits do comprise the LFSR sequence and provides a detection indication. If too many bits disagree, the receiver can repeat the search for the sequence by reloading its shift register from incoming bits, generating a new sequence, and again comparing. The receiver can repeat the search until it detects the sequence or terminates the search for some other reason.

To locate a sequence by the method described above requires that the local sequence be correctly generated. This, in turn, requires that the entire portion of the bit stream from which the local shift register begins its sequence be loaded without errors. Errors introduced during transmission over a noisy channel can corrupt the bit stream and reduce the probability of correctly loading the register. To overcome the effects of noise and increase the probability of locating the sequence, a receiver can use digital error correction.

Some error correction methods add redundancy to the transmitted message by including parity bits, which provide the information needed by the receiver to make correct decisions from corrupted data. This redundancy is inherent in an LFSR sequence, since each calculated parity bit feeds back as the next information bit.

Correcting errors in an LFSR sequence is described in U.S. Pat. No. 4,667,327, entitled "Error Corrector for a Linear Feedback Shift Register Sequence," issued May 19, 1987, to Bright et al., which is assigned to the same assignee as the present invention, and is incorporated by reference as if set forth fully herein. In the method described in that patent, the error corrector shifts bits into a register as they are received and generates parity bits according to the characteristic polynomial used in the transmitter for generating the LFSR sequence. It does not feed back the parity bits; instead, it compares subsequently received bits with corresponding parity bits and stores the comparison results in a syndrome register. It computes estimates of the errors from the contents of the syndrome register and uses the estimates to correct errors in the received sequence.

For detection in a noisy transmission environment, it would appear desirable to combine error correction with the method described earlier for detection of an LFSR sequence. It has been found, however, that this combination has the undesirable property that, when the input to the detector is random data or noise, the detector has a high probability of erroneously indicating the presence of an LFSR sequence. This results because the error correction process creates short-term correlation between the locally generated sequence and the random input signal from which it was derived. The sequence generated from the vector of error-corrected, random input bits will correlate with the random input over a certain number of bits before or after the vector.

Without this short-term correlation, comparisons between successive bits of the local sequence and a random input sequence would agree only about fifty percent of the time. Because of the correlation, comparisons agree significantly more often than fifty percent of the time. The number of agreements can be sufficiently large to satisfy the criterion for indicating detection of an LFSR sequence. Such an indication is known as a "false" detection.

The problem thus facing those skilled in the art is that the sequence detection method requires error correction to function properly under certain conditions, such as when noise corrupts the transmitted data, but error correction as known in the prior art may result in an intolerable rate of false detection when only random data or noise is being received.

SUMMARY OF THE INVENTION

Accordingly, it is an object of this invention to detect a known sequence within an incoming data stream without significantly increasing the probability of false detection in the presence of random data or noise. In practicing the invention, a detector is provided that locates a shift register sequence within an incoming data stream by correlating the incoming data stream with a sequence generated locally based on a portion of the data stream. Two features improve reliability of detecting the sequence. First, error correction circuitry estimates errors that may have corrupted the sequence during transmission across a noisy channel and corrects them to the extent possible. Second, the interval during which the incoming data stream is correlated with the local sequence is shifted either ahead or behind the portion of the error-corrected data stream used to initialize the local sequence generator, thereby avoiding the region during which short term correlation between the data stream and local sequence would otherwise cause false indications of detection when only noise or random data is being received.

BRIEF DESCRIPTION OF THE DRAWINGS

The features of the present invention that are believed to be novel are set forth with particularity in the appended claims. The invention, together with further objects and advantages thereof, may be understood by reference to the following description taken in conjunction with the accompanying drawings, in which like reference numerals identify like elements and in which:

DETAILED DESCRIPTION OF THE INVENTION

Figure 1:
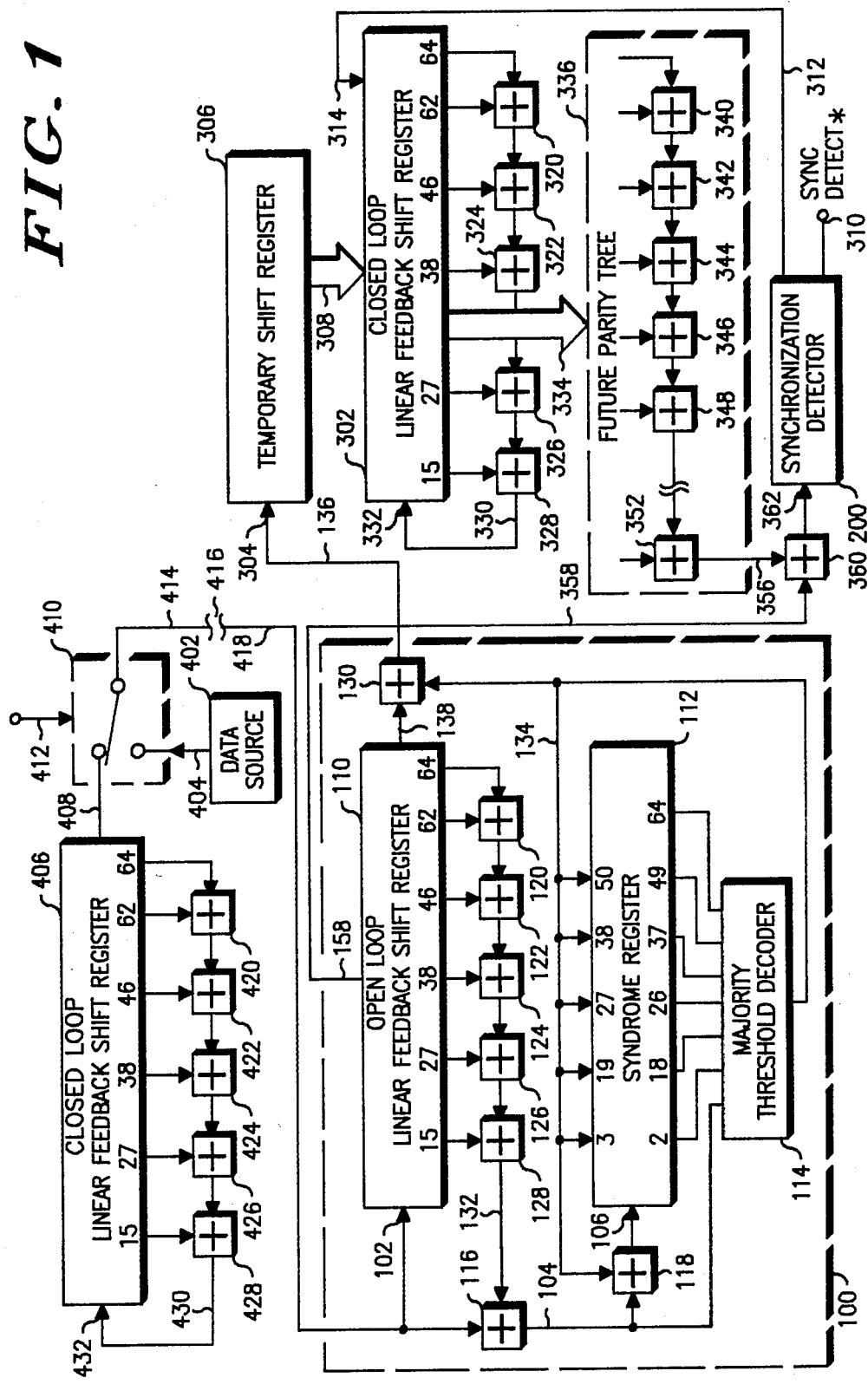
FIG. 1 is a block diagram of a sequence detector constructed in accordance with the present invention in which bits from a received data stream are compared with a predicted version of a locally generated sequence.

FIG. 1 shows an embodiment of the invention operating in a simplified communication system that includes: a transmitter, a communication channel, which may introduce noise, and a receiver, which has a circuit 100 to correct errors in the received sequence and a synchronization detector 200 to correlate the received sequence with a locally generated sequence derived from the received signal. While the principles of the invention may be realized in a variety of embodiments, four will be discussed here.

The transmitter includes a source 402 of arbitrary serial data 404, a generator 406 for developing a synchronization sequence 408, and a switch 410 that selects, on command of control line 412, either the source data 404 or the synchronization sequence 408 for output at 414 onto a communication channel 416. The sequence generator is a linear feedback shift register (LFSR) that generates a pseudo-random, maximal length sequence according to characteristic polynomial, C(x), where:

$$c(x) = 1 + x^{15} + x^{27} + x^{38} + x^{46} + x^{62} + x^{64}.$$

Outputs from shift register stages corresponding to non-zero coefficients in the polynomial add in exclusive-OR gates 420, 422, 424, 426, and 428 to form parity signal 430, which feeds back to the first stage of the register at 432. Those skilled in the art will appreciate that the length of the shift register and the characteristic polynomial are matters of design choice depending on the particular application required.

The output 414 of the transmitter reaches the receiver at 418 via communication channel 416. During transmission, errors may corrupt both the serial data and the synchronization sequence. The receiver uses circuit 100 to estimate and, within limits, correct errors in a shift register synchronization sequence. No provision is made in this embodiment to correct errors in random serial data.

A suitable embodiment for circuit 100 is fully described in U.S. Pat. No. 4,667,327, entitled "Error Corrector for a Linear Feedback Shift Register Sequence," issued May 19, 1987, to Bright et al., and it will be briefly described here. The received bits shift into register 110 at input 102. Exclusive-OR gates 120, 122, 124, 126, and 128, arranged according to the characteristic polynomial used in the transmitter, combine outputs of the register to form a parity bit at 132. The parity bit does not feed back into the register 110; instead, it drives one side of exclusive-OR gate 116, which compares the parity bits with the received bits. When the expected LFSR sequence is received, each parity bit and corresponding incoming bit should agree; a difference indicates either that the received bit is not from the expected sequence or that the bit is from the sequence but has been corrupted by noise.

A difference causes exclusive-OR gate 116 to indicate a logical true level. Successive bits from gate 116 shift through gate 118 into syndrome register 112. Selected outputs of the syndrome register represent past estimated errors and feed majority threshold decoder gate 114. The majority gate also receives the most recent estimated error from signal 104, which improves the ability of the circuit to correct errors under high error rate conditions. The decode threshold is 1 greater than a majority to account for this additional input.

When sufficient estimates of error in the syndrome register 112 coincide with the taps feeding the majority gate 114, its output 134 asserts, indicating that an error has been estimated in the bit at 138 that is at this time being shifted out of register 110. Signal 134 corrects the bit by complementing it in exclusive-OR gate 130, making corrected bits available at 136. Additionally, signal 134 complements the error terms as they shift into succeeding stages in the syndrome register 112 and complements signal 104 as it passes through gate 118 to feed into the syndrome register at 106. This is known as syndrome resetting, which has the effect of removing error terms greater that the length of the shift register and which further improves the error correction capability of the circuit.

As the corrected bit stream becomes available at 136, the receiver uses it to search for the LFSR sequence by performing several steps. First, it loads a portion of the corrected bit stream into shift register 302. Next, it locally regenerates an LFSR sequence continuing from that initial load, using a parity tree to provide feedback at 332 according to the characteristic polynomial in the transmitter. At the same time, it derives a sequence shifted from that in register 302, using future bit parity tree 336 to provide the shifted sequence at 356. Finally, it correlates the shifted sequence at 356 with a correspondingly shifted input sequence at 358, using detector 200 to indicate by signal sync-detect* at 310 whether the received signal is the expected LFSR sequence.

If the initial load in closed-loop register 302 were incorrect to generate the LFSR sequence, detector 200 would fail to indicate detection. In that event, register 302 would have to be reloaded for a new attempt to generate the sequence. The preferred embodiment uses a parallel loading arrangement that saves time and can give more chances to reload when only a limited number of bits of the LFSR sequence are transmitted. To shift out the incorrect bits from register 302 and refill it in serial would require shifting in 64 new bits. However, by loading in parallel, new bits replace incorrect bits in a single operation and save the time otherwise needed for 64 shifts.

The length of the correlation interval is 48 bits. After correlation, 48 bits will have shifted into register 302 from the feedback parity tree at 332 and must be replaced. Sixteen of the initial 64 bits will have been shifted by 48 places, but they will remain in register 302 and may be kept. During the correlation interval, temporary shift register 306 receives 48 error-corrected bits in serial at 304 and stores them. Then, on command from line 314, the parallel load operation sends 48 new bits on bus 308 from register 306 to replace the 48 feedback bits in register 302, leaving the other 16 bits in place.

To form the parity bit 330 that feeds back at 332 to regenerate the LFSR sequence, exclusive-OR gates 320, 322, 324, 326, and 328 add outputs of register 302 selected according to the characteristic polynomial used in the transmitter. Each parity bit computed is the next bit in sequence following the 64 bit vector initially loaded in shift register 302.

Future parity tree 336 provides at 356 a sequence of bits shifted ahead of the sequence of parity bits feeding back at 330 to register 302. The polynomial, P(x), to compute the parity shifted by (i) bits may be determined from the characteristic polynomial for the sequence, C(x), as:

$$P(x) = x^{-(i+1)} \bmod C(x).$$

In other words, P(x) is the remainder after dividing $x^{-(i+1)}$ by the characteristic polynomial C(x). Some examples are computed below, where positive values of index (i) mean a shift to the future, and negative values mean a shift to the past.

| i | P(x) |
|---|---|
| +25 | $x^1 + x^4 + x^{12} + x^{16} + x^{20} + x^{27} + x^{35} + x^{36} + x^{38} + x^{51} + x^{53}$ |
| +15 | $x^{11} + x^{14} + x^{22} + x^{26} + x^{30} + x^{37} + x^{45} + x^{46} + x^{48} + x^{61} + x^{63}$ |
| 0 | $x^{14} + x^{26} + x^{37} + x^{45} + x^{61} + x^{63}$ |
| −1 | $x^0 = 1$ |
| −64 | $x^{63}$ |
| −65 | $1 + x^{15} + x^{27} + x^{38} + x^{46} + x^{62}$ |
| −69 | $1 + x^2 + x^4 + x^{15} + x^{17} + x^{19} + x^{27} + x^{29} + x^{31} + x^{38} + x^{40} + x^{42} + x^{46} + x^{50} + x^{62}$ |

The polynomial terms indicate how to combine taps on the intermediate stages of shift register 302. The zero degree term corresponds to the output of the first stage of the register, the first degree term refers to the output of the second stage, and so on until the 63rd degree term, which indicates the output of the 64th, or last, stage of the register. A zero coefficient indicates to ignore that output; a non-zero coefficient indicates to include that particular intermediate output in the parity sum.

In the embodiment of FIG. 1, future bit parity tree 336 provides a sequence shifted ahead of the feedback sequence. Exclusive-OR gates 340, 342, 344, 346, and 348 through 352 represent the parity tree, which sums outputs of selected taps 334 of shift register 302. For example, to compute a sequence shifted 25 bits into the future requires ten exclusive-OR gates to sum the eleven non-zero terms in polynomial P(x).

A shifted version of the input sequence corresponding to the future parity sequence is obtained by taking a tap somewhere ahead of the output stage of register 110. The feedback parity sequence 330 corresponds in time to the bit sequence coming out of the open loop register 110 at 138 and available with error correction at 136. Register 110 delays the input sequence by 64 bits, so a sequence shifted ahead by the equivalent shift in the future parity tree, up to 64 bits, is available at one of the intermediate stages in the register For example, to obtain a shift of 25 bits, line 158 would take the input sequence from tap 39 of the register, which is 25 bits ahead of the output at the 64th stage.

Finally, the two sequences are correlated during a suitable measuring interval. Exclusive-OR gate 360 compares corresponding bits from the two sequences coupled to it on lines 356 and 358 and indicates errors by logical true on output 362 whenever they differ. Detector 200 accumulates the comparisons for a predetermined number of bits and indicates detection if the number of disagreements is less than a selected limit.

Figure 2:
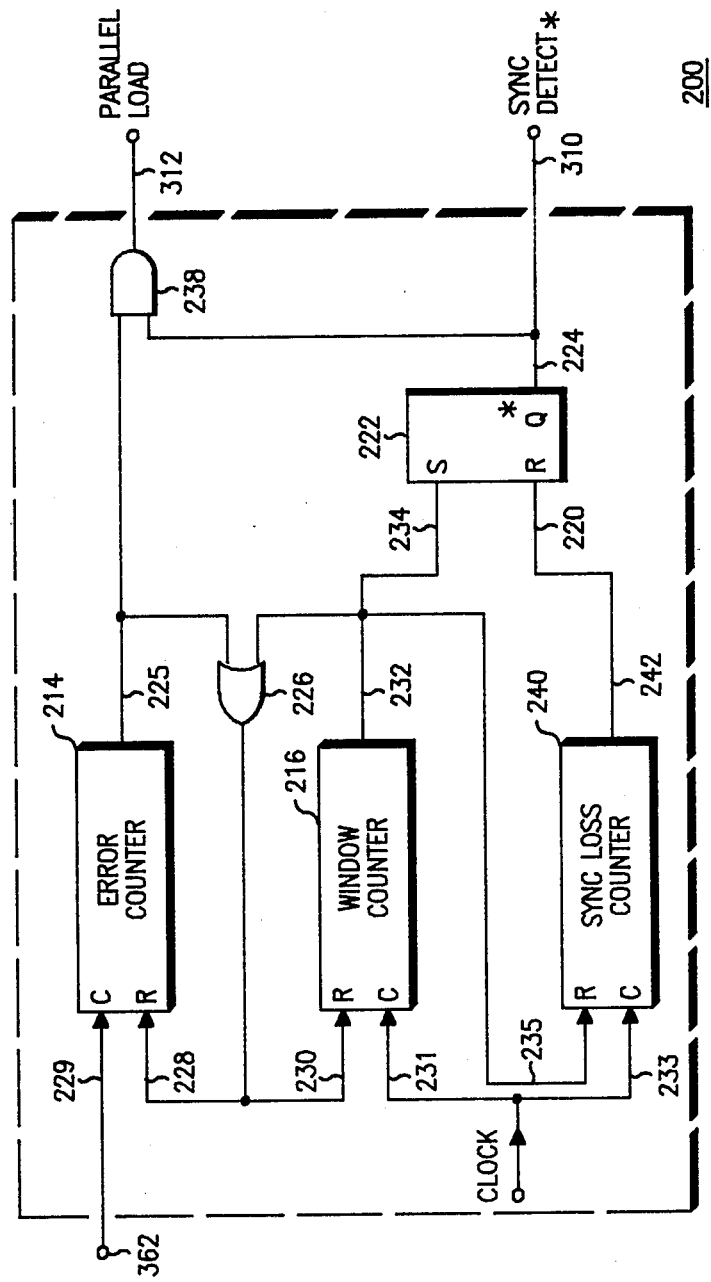
FIG. 2 is a block diagram showing in somewhat greater detail the synchronization detector of FIGS. 1, 3, 4, and 5.

FIG. 2 which shows in detail that detector 200 comprises a window counter 216, an error counter 214, a sync loss counter 240, and miscellaneous logic circuitry for internal resetting and for providing output signals 310 and 312. In response to a clock synchronized with the sequences and supplied at pin 231, the window counter counts towards a terminal count, which defines the correlation interval and is chosen here as 48, while the error counter accumulates error indications supplied by line 362 to its clock pin 229. The terminal count outputs of the two counters at 225 and 232 combine in OR gate 226, whose output goes to the reset pins of the error counter at 228 and the window counter at 230. Whichever counter reaches terminal count first resets both.

Initially, flip-flop 222 must be reset and will indicate logical true on the Q* output 224, meaning that sync has not been detected. If sufficient error counts arrive on line 362 for the error counter to reach its terminal count before the window counter resets it, the error counter asserts line 225, which, combining in AND gate 238 with the logical true on line 224, sends a parallel load signal on line 312 to shift register 302 at pin 314. Upon receiving the parallel load signal, register 302 reloads from the contents of temporary register 306 and begins generating a sequence from the new load vector.

In contrast, if few error indications arrive on line 362, the window counter will reach its terminal count before the error counter does and will assert line 232. Line 232 sets flip-flop 222 at pin 234, and output 224 negates and inhibits gate 238 from sending a parallel load signal to the shift register. The sequence generator continues to generate the sequence according to its initial load vector. Sync-detect* negates, indicating that the LFSR sequence has been detected.

In the preferred embodiment, sync loss counter 240 provides detection hysteresis, which allows the detector 200 to accept momentary bursts of errors in the received sequence or to fail to detect a predetermined number of synchronization sequences in the message format without immediately removing indication of detection. Each time window counter 216 reaches terminal count and asserts line 232, it triggers line 235 to reset sync loss counter 240, which itself counts clock pulses supplied at pin 233 from the master clock. As long as the correct LFSR sequence continues to arrive, the window counter will reach terminal count and provide an output at 232 before the error counter can reset it.

If the correct LFSR sequence stops arriving, error counter 214 begins to accumulate a sufficient number of counts to reach its terminal count before the window counter resets it, and the error counter will force both the window counter and itself to reset. This prevents the window counter from resetting the sync loss counter, which continues towards its own terminal count. If errors continue to occur in each window period for longer than the predetermined hysteresis interval, sync loss counter 240 reaches terminal count, asserts its output at 242, and resets flip-flop 222 at pin 220. The Q* output 224 asserts, indicating loss of detection on 310 and removing the inhibit from gate 238. Gate 238 will be able to pass the parallel load signal when the error counter next indicates an accumulation of errors.

Those skilled in the art will appreciate that detector 200 represents just one way to detect correlation of sequences and that other detectors may be substituted while still maintaining the spirit of the invention. Also, FIG. 1 shows just one configuration, in which a local sequence shifted forward by a future parity tree is correlated with the uncorrected, received sequence. Other variations are contemplated within the scope of the invention and will be described briefly below.

Figure 3:
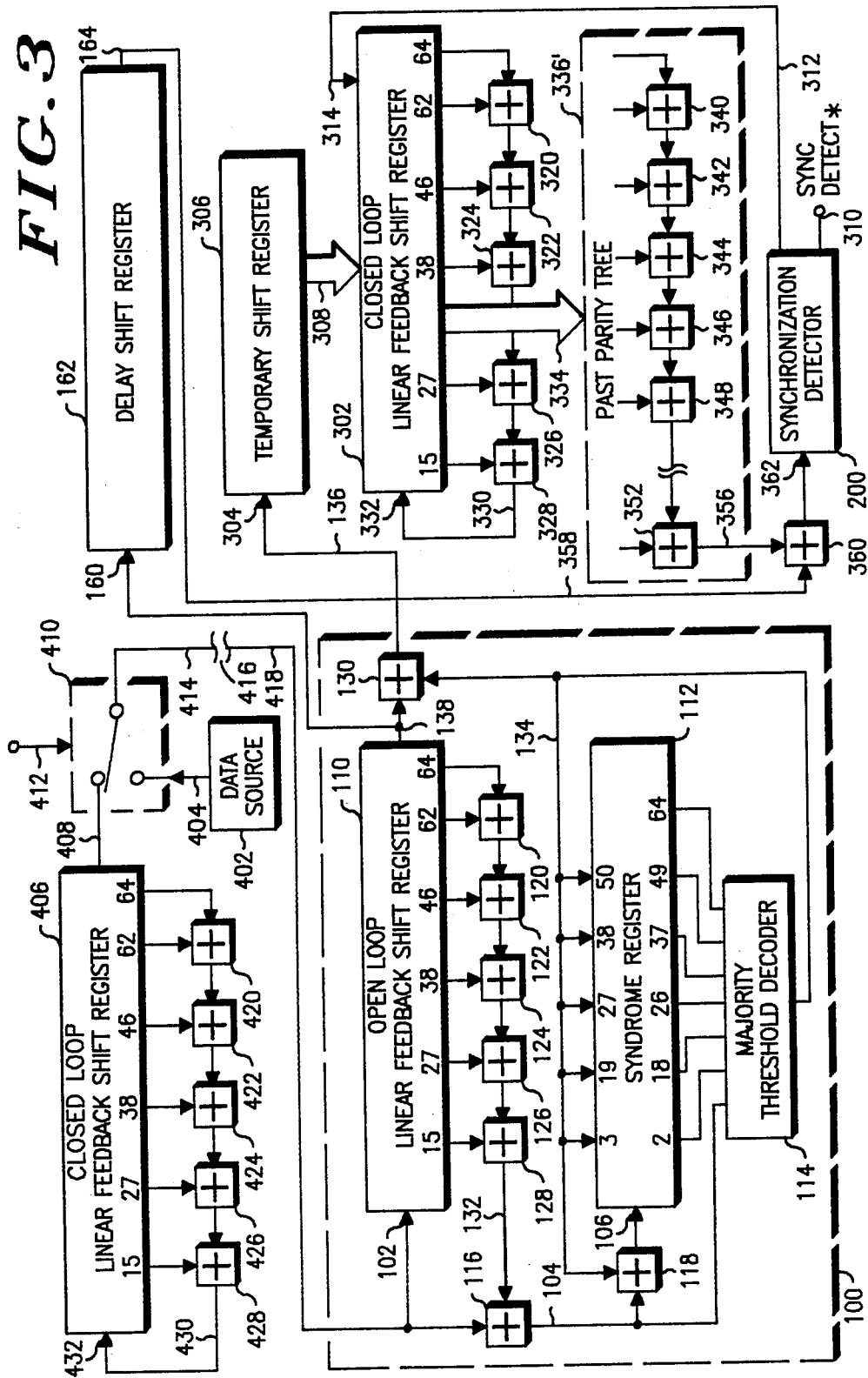
FIG. 3 is a block diagram of a sequence detector in which bits from a received data stream are compared with a delayed version of a locally generated sequence.

Referring now to FIG. 3a sequence detector is shown in which a local sequence delayed by a past parity tree is compared with an uncorrected, received sequence delayed an equivalent amount. In this embodiment, parity tree 336' is designed according to the formulas above for negative values of delay parameter (i). Uncorrected bits at 138 taken from the output stage of shift register 110 enter delay shift register 162 at point 160. The further delayed output at 164 couples on line 358 to exclusive-OR gate 360, which compares it with input 356 from the past bit parity tree. In other respects, the detector of FIG. 3 functions in like manner as that of FIG. 1.

The delay in past parity tree 336' and the delay through register 162 must exceed the delay inherent in feedback shift register 302. Suppose that the parity tree delay is less than the total feedback register delay of 64 bits but is at least 48 bits. During the correlation period, 48 feedback parity bits shift into closed loop register 302 at 332. With a 48 bit delay, for example, the past parity sequence at 356 is what the feedback parity sequence 330 was 48 bits earlier. After 48 shifts, the bit in the 48th position of register 302 is the 48th previous parity bit, which is the bit that past parity sequence 356, delayed by 48 bits, produces at that instant.

At the beginning of the correlation period, register 302 will have just been loaded with error corrected bits by temporary register 306. Register 162 will contain uncorrected bits corresponding to the corrected bits loaded into the feedback register. The error correction circuit 100 modifies about 7% of the bits when it receives a random noise input; therefore, the bits in delay shift register 162 and in feedback register 302 will correlate about 93% of the time.

Synchronization detector 200 correlates the past parity bits at 356 delayed by 48 bits with input bits similarly delayed and taken from the end of delay shift register 162. The next 48 bits that shift out at 164 and feed exclusive-OR gate 360 for comparison will be nearly identical with the corresponding 48 bits in the feedback shift register 302. The past parity sequence will be identical with what was stored in the feedback register at the start of the correlation period, because each bit in the feedback register is a feedback parity bit from earlier in the sequence. These sequences correlate about 93% of the time, which is sufficient to cause the synchronization detector to indicate detection Such an indication is known as a "false" detection, for its occurrence is unrelated to the presence of the expected LFSR sequence.

If the delay in the past parity sequence at 356 and the delay through register 162 were less than 48 bits, some new bits that were not part of the initial load vector in feedback register 302 would shift in during the correlation period. Correlation would be less than 93% but still higher than 50% as desired for lowest false detection rate. The delay through the past parity tree 336' and the delay register 162 must exceed the delay of the feedback register 302 to avoid comparing nearly alike bits. In the preferred embodiment, a delay of about 112 bits suffices to reduce correlation on noise to 50%.

Figure 4:
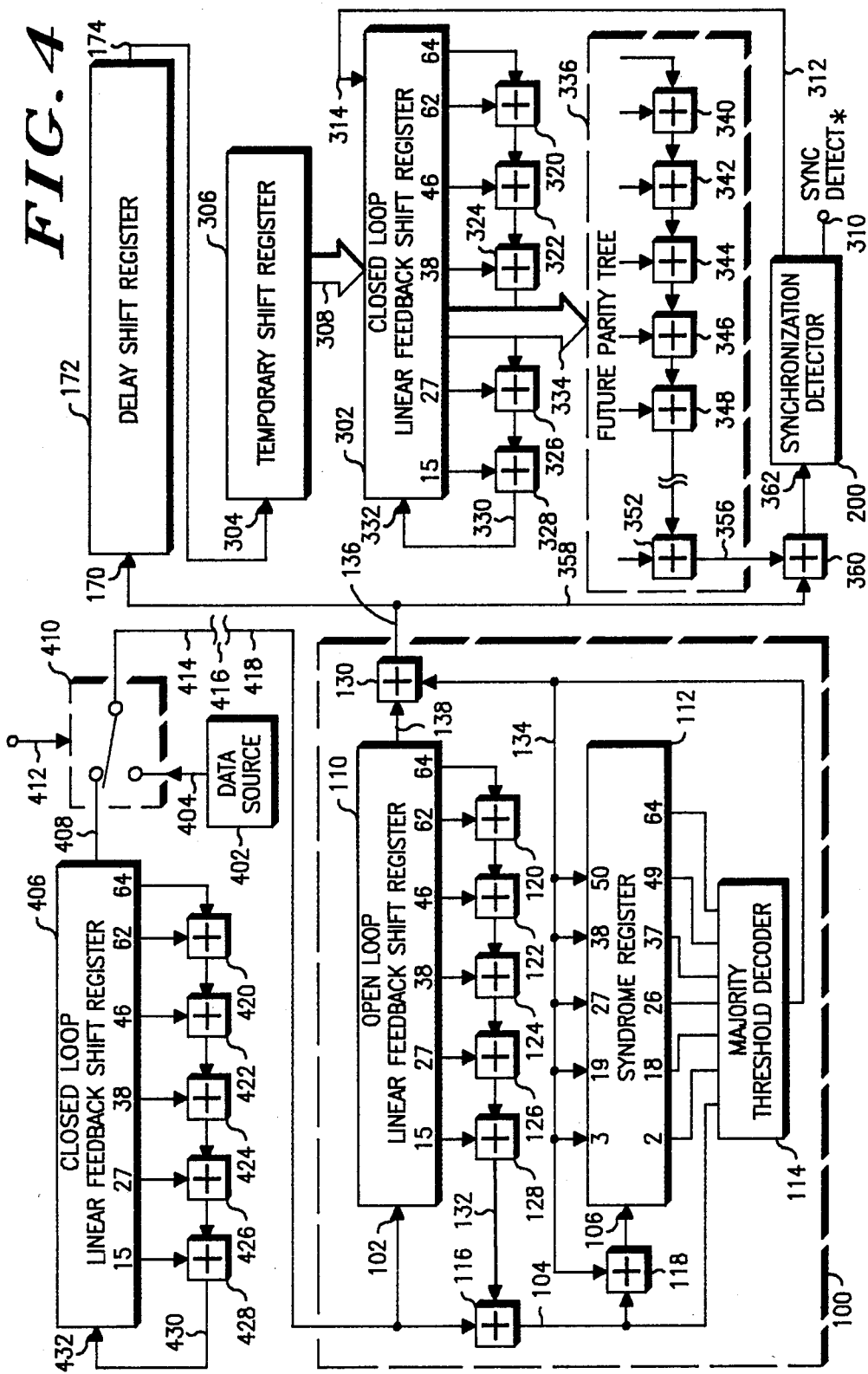
FIG. 4 is a block diagram of a sequence detector in which bits from an error-corrected data stream are compared with a predicted version of the locally generated sequence.

FIG. 4 illustrates a sequence detector in which a sequence from a future bit parity tree is correlated with a corrected bit sequence taken from the output of error correction circuit 100. Interposing additional delay between output 136 of the error correction circuit 100 and input 304 of the temporary register gives the effect of an equivalent amount of prediction in the error-corrected bit sequence as in the future bit parity sequence. Output 136 feeds input 170 of delay shift register 172 but goes directly on line 358 to exclusive-OR 360 for comparison with the parity bit sequence at 356. Output 174 provides delayed input at 304 to the local sequence generator. The delay from register 172 balances the shift created in the future parity calculation so that the two sequences at 356 and 358 align properly for correlation.

Figure 5:
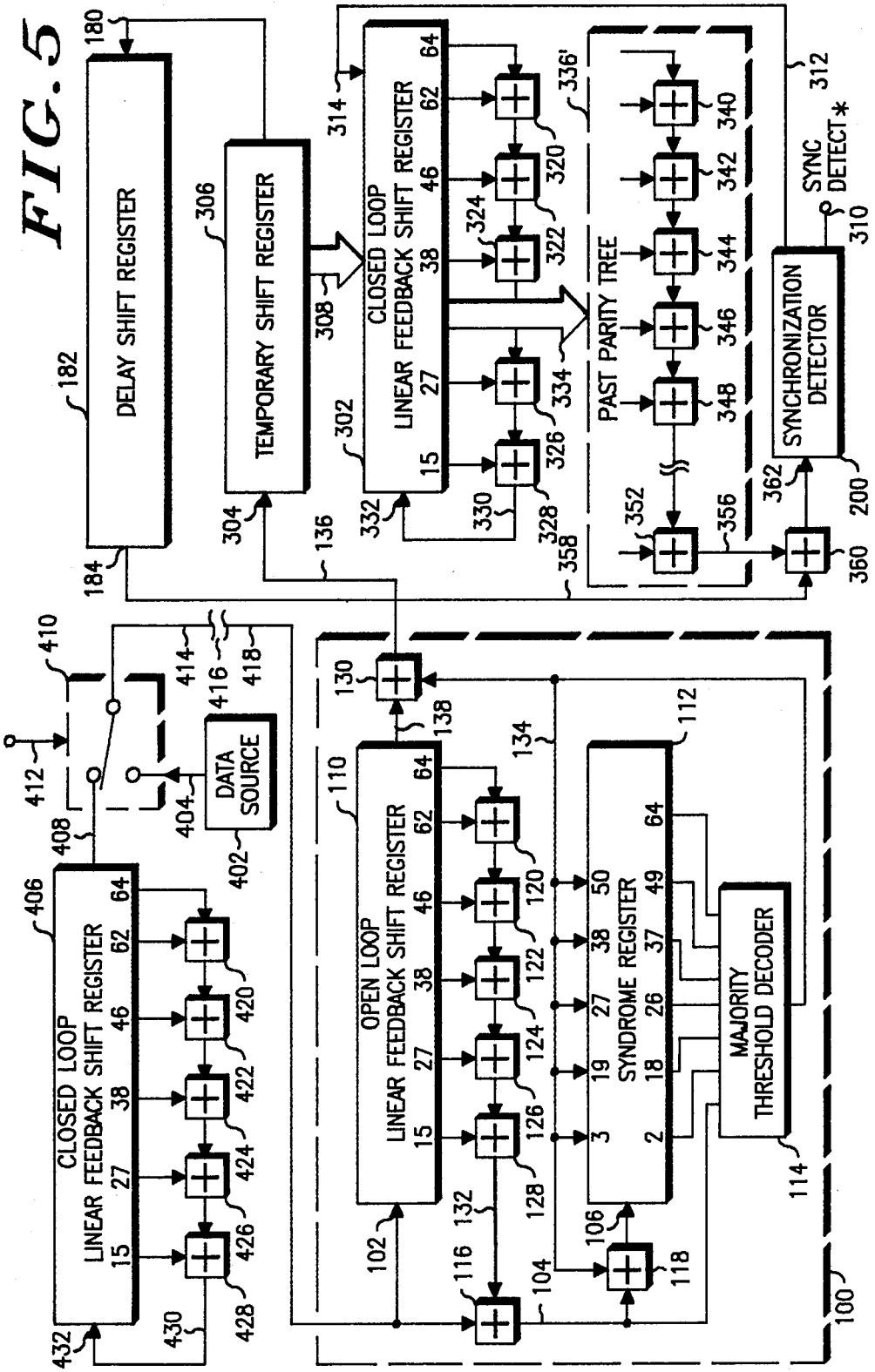
FIG. 5 is a block diagram of a sequence detector in which bits from an error-corrected data stream are compared with a delayed version of the locally generated sequence.

FIG. 5 illustrates yet another variation in which a past bit parity sequence is correlated with a further delayed, error-corrected sequence. Register 182 provides the additional delay for the error-corrected sequence by taking bits shifted out from temporary register 306 at 180, delaying them, and providing output at 184, which couples on line 358 to exclusive-OR 360. As in FIG. 3, parity tree 336' combines taps of register 302 according to the polynomials indicated above with negative values of index parameter (i).

Similar to what was noted earlier in the description of FIG. 3, the delay through the past parity tree 336' and the total delay through register 182 taken with the 48 bit delay through register 306 must exceed the delay through closed loop register 302. Otherwise, the sequence that the past parity tree 336' generates will be identical with the bits shifting out at 184 from register 182, regardless of the initial load in the closed loop register. This implies that the synchronization detector will always indicate correlation, which is incorrect.

Although four variations of a preferred embodiment have been described, message timing and format, as well as other considerations, will indicate the variation preferred in a particular application. The message format may be a limited number of bits of the shift register sequence at intervals between longer streams of data. Detecting the sequence within a few bits of its start then becomes imperative.

For the closed loop register to begin generating the local LFSR sequence, 64 bits must initially fill it. Correlation of the received signal with the sequence available at the parity tree cannot begin until those 64 bits have been loaded. This waiting time shortens the effective length of the synchronization sequence available to be used. Using the past bit parity configuration of FIG. 3 or FIG. 5 allows those bits to be reused, in effect. As bits are shifted into the closed loop register, they are stored in the additional delay register and can be used later for comparison with the delayed, past bit parity sequence. In contrast, the future parity configurations of FIG. 1 or FIG. 4 interpose delay between the pickoff point in the input sequence feeding the synchronization detector and the input to the temporary register that parallel loads the closed loop shift register. Although the initial bits arrive early at the pickoff point and are available for correlation, they have nothing with which to be compared until the closed loop register fills. The bits in the additional delay region between the pickoff point and the output of register 110 are wasted and further shorten the available length of sequence within the message format. This reduces the number of correlation attempts that may be made and thus lowers the probability of detection in a noisy environment.

False detection characteristics and hardware constraints indicate the amount of delay or prediction that may be used in practice. For the characteristic polynomial used in the preferred embodiment, the number of taps required for the past bit parity calculation increases rapidly for delays beyond 74 bits. Even though detection characteristics improve because of the ability to reuse bits, the past parity calculation requires numerous exclusive-OR gates, and the configuration requires a long additional shift register to delay the input sequence.

The degree of correlation between a random input signal and the locally generated past or future parity sequence derived from a portion of it varies with the amount of delay or prediction. Ideally, a random input and the local sequence would agree only 50 percent of the time. Using the parameters of the preferred embodiment, i.e., 64 bit maximal length shift register sequence and the error correction method described above, correlation on noise is about 70 percent with no amount of delay or prediction, but drops to 50 percent by going at least 112 bits into the past or 40 bits into the future. Using a shift of 25 bits into the future results in 54 percent correlation, which does not unduly increase the probability of false detection. This allows the invention to be practiced with very little shortening of the effective length of sequence available within a typical message format and without an excessive number of exclusive-OR gates required for the future parity bit computation.

Although bits either with or without error correction may be correlated with the locally generated sequence, correlating on uncorrected bits is preferred from both hardware savings and performance aspects. Comparing FIGS. 3, 4, and 5 with FIG. 1, it may be seen that using uncorrected bits with future parity calculation requires no additional delay registers, which saves register hardware. It has also been found that if the amount of prediction or delay offset used is insufficient to reduce correlation on random input to 50 percent, then correlation between corrected bits from a random input sequence and the local sequence derived from it is higher than correlation between uncorrected bits and the local sequence. Using the uncorrected bits would result in fewer false detection indications.

While a particular embodiment of the invention has been described and several variations shown, it should be understood that the invention is not limited thereto, as many modifications may be made. It is, therefore, contemplated to cover by the present application any and all such modifications that may fall within the true spirit and scope of the underlying principles disclosed and claimed herein.

What is claimed is:

1. A circuit for detecting whether a synchronization sequence that has been generated according to a known algorithm is present within a received data stream that may have become corrupted by errors, comprising:
   error-correction means, to which the received data stream couples, for producing from the received data stream an error-corrected stream in which, if the synchronization sequence is present in the received data stream, at least some of the errors in the synchronization sequence will have been corrected;
   local sequence generation means, coupled to the error-correction means, for genernating a local sequence by applying the known algorithm to the error-corrected stream;
   shifted local sequence generation means, coupled to the local sequence generation means, for generating a shifted local sequence by obtaining a shifted version of the local sequence;
   correlation means, coupled to the received data stream and the shifted local sequence generation means, for determining a degree of correlation between the received data stream and the shifted local sequence; and
   detection means, coupled to the correlation means, for indicating detection if the degree of correlation exceeds a detection threshold.

2. The circuit for detecting whether a synchronization sequence is present within a received data stream as described in claim 1 in which:
   the local sequence generation means comprises means for storing an initial portion comprising a predetermined number of bits of the error-corrected stream and generating a local sequence that starts from the initial portion and continues according to the known algorithm; and
   the shifted local sequence generation means comprises means for linearly combining bits selected from the local sequence to generate a shifted local sequence.

3. The circuit for detecting a synchronization sequence as described in claim 2 in which the known algorithm generates a linear feedback shift register sequence and in which the shifted local sequence either is delayed from the local sequence by more than the predetermined number of bits or is advanced from the local sequence.

4. The circuit for detecting whether a synchronization sequence is present within a received data stream as described in claim 1 in which the error-correction means comprises:
   parity signal generation means, coupled to the received data stream, for storing successive bits of the received data stream as stored bits and linearly combining selected stored bits to produce an open-loop parity signal;
   input delay means, coupled to the received data stream, for further delaying the received data stream to produce a delayed input sequence;
   comparison means, coupled to the received data stream and to the parity signal generation means, for comparing the received data stream with the open-loop parity signal to produce a present error estimation signal;
   error estimation signal storage means, coupled to the comparison means, for storing successive present error estimation signals as past error estimation signals;
   decoding means, coupled to the comparison means and the error estimation signal storage means, for decoding the present error estimation signal and selected past error estimation signals to produce a syndrome correction signal when a predetermined threshold is exceeded;

resetting means, coupled to the decoding means, for resetting the error estimation signals with the syndrome correction signal; and means, coupled to the decoding means and the input delay means, for combining the syndrome correction signal with the delayed input sequence to produce the error-corrected stream.

5. The circuit for detecting whether a synchronization sequence is present within a received data stream as described in claim 4 in which:

the local sequence generation means comprises means for storing an initial portion comprising a predetermined number of bits of the error-corrected stream and generating a linear feedback shift register sequence that starts from the initial portion;

the shifted local sequence generation means comprises means for linearly combining bits selected from the local sequence to generate a shifted local sequence; and the shifted local sequence either is delayed from the local sequence by more than the predetermined number of bits or is advanced from the local sequence.

6. A circuit for detecting whether a synchronization sequence that has been generated according to a known algorithm is present within a received data stream that may have become corrupted by errors, comprising:

error-correction means, to which the received data stream couples, for producing from the received data stream an error-corrected stream in which, if the synchronization sequence is present in the received data stream, at least some of the errors in the synchronization sequence will have been corrected;

local sequence generation means, coupled to the error-correction means, for generating a local sequence by applying the known algorithm to the error-corrected stream;

shifted local sequence generation means, coupled to the local sequence generation means, for generating a shifted local sequence by obtaining a shifted version of the local sequence;

correlation means, coupled to the error-corrected stream and the shifted local sequence generation means, for determining a degree of correlation between the error-corrected steram and the shifted local sequence; and detection means, coupled to the correlation means, for indicating detection if the degree of correlation exceeds a detection threshold.

7. The circuit for detecting whether a synchronization sequence is present within a received data stream as described in claim 6 in which:

the local sequence generation means comprises means for storing an initial portion comprising a predetermined number of bits of the error-corrected stream and generating a local sequence that starts from the initial portion and continues according the known algorithm; and the shifted local sequence generation means comprises means for linearly combining bits selected from the local sequence to generate a shifted local sequence.

8. The circuit for detecting a synchronization sequence as described in claim 7 in which the known algorithm generates a linear feedback shift register sequence and in which the shifted local sequence either is delayed from the local sequence by more than the predetermined number of bits or is advanced from the local sequence.

9. The circuit for detecting whether a synchronization sequence is present within a received data stream as described in claim 6 in which the error-correction means comprises:

parity signal generation means, coupled to the received data stream, for storing successive bits of the received data stream as stored bits and linearly combining selected stored bits to produce an open-loop parity signal;

input delay means, coupled to the received data stream, for further delaying the received data stream to produce a delayed input sequence;

comparison means, coupled to the received data stream and to the parity signal generation means, for comparing the received data stream with the open-loop parity signal to produce a present error estimation signal;

error estimation signal storage means, coupled to the comparison means, for storing successive present error estimation signals as past error estimation signals;

decoding means, coupled to the comparison means and the error estimation signal storage means, for decoding the present error estimation signal and selected past error estimation signals to produce a syndrome correction signal when a predetermined threshold is exceeded;

resetting means, coupled to the decoding means, for resetting the error estimation signals with the syndrome correction signal; and means, coupled to the decoding means and the input delay means, for combining the syndrome correction signal with the delayed input sequence to produce the error-corrected stream.

10. The circuit for detecting whether a synchronization sequence is present within a received data stream as described in claim 9 in which:

the local sequence generation means comprises means for storing an initial portion comprising a predetermined number of bits of the error-corrected stream and generating a linear feedback shift register sequence that starts from the initial portion;

the shifted local sequence generation means comprises means for linearly combining bits selected from the local sequence to generate a shifted local sequence; and the shifted local sequence either is delayed from the local sequence by more than the predetermined number of bits or is advanced from the local sequence.

11. A method for detecting whether a synchronization sequence that has been generated according to a known algorithm is present within a received data stream that may have become corrupted by errors, comprising the steps of:

producing from the received data stream an error-corrected stream in which, if the synchronization sequence is present in the received data stream, at least some of the errors in the synchronization sequence will have been corrected;

generating a local sequence by applying the known algorithm to the error-corrected stream;

generating a shifted local sequence by obtaining a shifted version of the local sequence;

determining a degree of correlation between the received data stream and the shifted local sequence; and indicating detection if the degree of correlation exceeds a detection threshold.

12. The method for detecting whether a synchronization sequence is present within a received data stream as described in claim 11 in which:

the step of generating a local sequence comprises storing an initial portion comprising a predetermined number of bits of the error-corrected stream and generating a local sequence that starts from the initial portion and continues according to the known algorithm; and the step of generating a shifted local sequence comprises linearly combining bits selected from the local sequence.

13. The method for detecting a synchronization sequence as described in claim 12 in which the known alogorithm generates a linear feedback shift register sequence and in which the shifted local sequence either is delayed from the local sequence by more than the predetermined number of bits or is advanced from the local sequence.

14. The method for detecting whether a synchronization sequence is present within a received data stream as described in claim 11 in which the step of producing the error-corrected stream comprises the steps of:

storing successive bits of the received data stream as stored bits and linearly combining selected stored bits to produce an open-loop parity signal;

further delaying the received data stream to produce a delayed input sequence;

comparing the received data stream with the open-loop parity signal to produce a present error estimation signal;

storing successive present error estimation signals as past error estimation signals;

decoding the present error estimation signal and selected past error estimation signals to produce a syndrome correction signal when a predetermined threshold is exceeded;

resetting the error estimation signals with the syndrome correction signal; and combining the syndrome correction signal with the delayed input sequence to produce the error-corrected stream.

15. The method for detecting whether a synchronization sequence is present within a received data stream as described in claim 14 in which:

the step of generating a local sequence comprises storing an initial portion comprising a predetermined number of bits of the error-corrected stream and generating a linear feedback shift register sequence that starts from the initial portion;

the step of generating a shifted local sequence comprises linearly combining bits selected from the local sequence; and the shifted local sequence either is delayed from the local sequence by more than the predetermined number of bits or is advanced from the local sequence.

16. A method for detecting whether a synchronization sequence that has been generated according to a known algorithm is present within a received data stream that may have become corrupted by errors, comprising the steps of:

producing from the received data stream an error-corrected stream in which, if the synchronization sequence is present in the received data stream, at least some of the errors in the synchronization sequence will have been corrected;

generating a local sequence by applying the known algorithm to the error-corrected stream;

generating a shifted local sequence by obtaining a shifted version of the local sequence;

determining a degree of correlation between the error-corrected stream and the shifted local sequence; and indicating detection if the degree of correlation exceeds a detection threshold.

17. The method for detecting whether a synchronization sequence is present within a received data stream as described in claim 16 in which:

the step of generating a local sequence comprises storing an initial portion comprising a predetermined number of bits of the error-corrected stream and generating a local sequence that starts from the initial portion and continues according to the known algorithm; and the step of generating a shifted local sequence comprises linearly combining bits selected from the local sequence.

18. The method for detecting a synchronization sequence as described in claim 17 in which the known algorithm generates a linear feedback shift register sequence and in which the shifted local sequence either is delayed from the local sequence by more than the predetermined number of bits or is advanced from the local sequence.

19. The method for detecting whether a synchronization sequence is present within a received data stream as described in claim 16 in which the step of producing the error-corrected stream comprises the steps of:

storing successive bits of the received data stream as stored bits and linearly combining selected stored bits to produce an open-loop parity signal;

further delaying the received data stream to produce a delayed input sequence;

comparing the received data stream with the open-loop parity signal to produce a present error estimation signal;

storing successive present error estimation signals as past error estimation signals;

decoding the present error estimation signal and selected past error estimation signals to produce a syndrome correction signal when a predetermiend threshold is exceeded;

resetting the error estimation signals with the syndrome correction signal; and combining the syndrome correction signal with the delayed input sequence to produce the error-corrected stream.

20. The method for detecting whether a synchronization sequence is present within a received data stream as described in claim 19 in which:

the step of generating a local sequence comprises storing an initial portion comprising a predetermined number of bits of the error-corrected stream and generating a linear feedback shift register sequence that starts from the initial portion;

the step of generating a shifted local sequence comprises linearly combining bits selected from the local sequence; and the shifted local sequence either is delayed from the local sequence by more than the predetermined number of bits or is advanced from the local sequence.

* * * * *